United States Patent
Yamano

(10) Patent No.: US 6,831,869 B2
(45) Date of Patent: Dec. 14, 2004

(54) SEMICONDUCTOR MEMORY DEVICE AND ELECTRONIC INFORMATION DEVICE USING THE SAME

(75) Inventor: Kaname Yamano, Ibaraki (JP)

(73) Assignee: Sharp Kabushiki Kaisha, Abeno-ku (JP)

(*) Notice: Subject to any disclaimer, the term of this patent is extended or adjusted under 35 U.S.C. 154(b) by 0 days.

(21) Appl. No.: 10/355,344

(22) Filed: Jan. 31, 2003

(65) Prior Publication Data

US 2003/0142563 A1 Jul. 31, 2003

(30) Foreign Application Priority Data

Jan. 31, 2002 (JP) ...................................... 2002-024667

(51) Int. Cl.[7] ............................................. G11C 7/00
(52) U.S. Cl. ................... 365/200; 365/218; 365/189.01
(58) Field of Search ........................ 365/200, 189.01, 365/189.04, 218, 189.07, 203.06, 210

(56) References Cited

U.S. PATENT DOCUMENTS

| | | | |
|---|---|---|---|
| 5,392,246 A | 2/1995 | Akiyama et al. | |
| 5,652,725 A | 7/1997 | Suma et al. | |
| 5,666,316 A | 9/1997 | Rieger | |
| 5,970,001 A | * 10/1999 | Noda et al. | 365/200 |
| 5,978,273 A | * 11/1999 | Shigemura | 365/185.29 |
| 6,304,498 B1 | * 10/2001 | Ikeda | 365/200 |
| 2001/0026967 A1 | 10/2001 | Koshikawa | |

FOREIGN PATENT DOCUMENTS

| | | |
|---|---|---|
| EP | 0 411 626 | 2/1991 |
| JP | 06-005093 | 1/1994 |

OTHER PUBLICATIONS

Austrian Patent Office Search and Examination Report mailed on Feb. 27, 2004, for Singapore Application No. 200300215–1, nine pages.

* cited by examiner

Primary Examiner—Thong Le
(74) Attorney, Agent, or Firm—Morrison & Foerster LLP

(57) ABSTRACT

In a semiconductor memory device, a redundant memory cell is accessible based on an input address signal by a redundant word line selection signal which is output in accordance with whether data read is to be performed or a memory operation other than data read is to be performed.

12 Claims, 7 Drawing Sheets

SEMICONDUCTOR MEMORY DEVICE AND ELECTRONIC INFORMATION DEVICE USING THE SAME

BACKGROUND OF THE INVENTION

1. Field of the Invention

The present invention relates to a semiconductor memory device used for an electronic information device such as, for example, a cellular phone, and in particular to a nonvolatile semiconductor memory device such as, for example, a flash EEPROM. The present invention also relates to an electronic information device using such a semiconductor memory device.

2. Description of the Related Art

In one type of conventional semiconductor memory device, a non-redundant, regular memory cell is accessed based on an input address signal, and when a regular word line used for accessing the regular memory cell is defective, a redundant word line is used instead of the regular word line so as to access a redundant memory cell.

With reference to FIGS. 4 through 6, such a conventional semiconductor memory device will be described.

FIG. 4 is a block diagram illustrating a partial structure of a conventional semiconductor memory device 100. More specifically, FIG. 4 shows a partial structure of a control system for selecting a regular word line and a redundant word line.

As shown in FIG. 4, the semiconductor memory device 100 includes an address redundancy determination circuit CAJD, a regular and redundant word line control circuit CXDEC1, a plurality of regular memory cell arrays MRG, a plurality of redundant memory cell arrays MRD, a plurality of regular word line drivers CDRV, and a plurality of redundant word line drivers CRDRV1.

The address redundancy determination circuit CAJD determines whether an input address signal SAD (externally input) and a defective address signal SBAD match each other and outputs an address redundancy match signal SAM as an output determination signal (for example, a defective word line determination signal) which represents the determination result for each address. When the input address signal SAD and the defective address signal SBAD match each other, the level of the address redundancy match signal SAM is HIGH. When the input address signal SAD and the defective address signal SBAD do not match each other, the level of the address redundancy match signal SAM is LOW.

The regular and redundant word line control circuit CXDEC1 outputs a redundant word line selection signal SRED when the address redundancy match signal SAM is at the HIGH level, and outputs a regular word line selection signal SREG when the address redundancy match signal SAM is at the LOW level.

The semiconductor memory device 100 includes a plurality of memory cell array areas referred to as memory blocks. Each memory cell array area includes a plurality of regular memory cell arrays MRG and a plurality of redundant memory cell arrays MRD. Each regular memory cell array MRG includes a plurality of memory cells, and each redundant memory cell array MRD includes a plurality of memory cells. Memory operations including data write to a plurality of prescribed memory cells corresponding to an input address signal SAD and data read and erase from a plurality of memory cells can be performed.

Each memory cell array area includes one regular word line driver CDRV and one redundant word line driver CRDRV1. In order to perform the above-described memory operations, each regular word line driver CDRV selects a regular word line corresponding to the input address signal SAD, or each redundant word line driver CRDRV1 selects a redundant word line corresponding to the input address-signal SAD.

With the above-described structure, an input address signal SAD having a plurality of bits is input to the address redundancy determination circuit CAJD and also to the regular and redundant word line control circuit CXDEC1.

The address redundancy determination circuit CAJD receives a defective address signal SBAD as well as the input address signal SAD, and determines whether the input address signal SAD matches the defective address signal SBAD or not.

As described above, when the input address signal SAD and the defective address signal SBAD match each other, the level of the address redundancy match signal SAM (as a determination signal regarding each input address signal SAD) is HIGH. When the input address signal SAD and the defective address signal SBAD do not match each other, the level of the address redundancy match signal SAM is LOW. The address redundancy match signal SAM is output from the address redundancy determination circuit CAJD to the regular and redundant word line control circuit CXDEC1.

When the address redundancy match signal SAM is at the HIGH level, the regular and redundant word line control circuit CXDEC1 outputs a redundant word line selection signal SRED to one of the redundant word line drivers CRDRV1. When the address redundancy match signal SAM is at the LOW level, the regular and redundant word line control circuit CXDEC1 outputs a regular word line selection signal SREG to one of the regular word line drivers CDRV.

Based on the word line selection signal, the regular word line driver CDRV or the redundant word line driver CRDRV1 corresponding to a selected memory block (memory block selection signal SBLK is HIGH) is activated, and a desired regular memory cell array MRG or a desired redundant memory cell array MRD is selected. This selection is performed by raising the potential of a regular word line WLREG corresponding to the desired regular memory cell array MRG or the potential of a redundant word line WLRED corresponding to the desired redundant memory cell array MRD. In this manner, memory operations including data write to, data read from, or data erase from a memory cell corresponding to the input address signal SAD are performed.

FIG. 5 is a block diagram illustrating a partial structure of conventional regular and redundant word line selection circuits including the regular and redundant word line control circuit CXDEC1.

As shown in FIG. 5, the regular and redundant word line control circuit CXDEC1 includes a comprehensive redundancy determination circuit CJD, an erase processing circuit CER, a forcible redundant word line selection control circuit CAR, and a regular word line predecoder CPD1. A redundant word line selection circuit CXRED1 includes the comprehensive redundancy determination circuit CJD, the erase processing circuit CER, the forcible redundant word line selection control circuit CAR, and the redundant word line driver CRDRV1. A regular word line selection circuit CXREG1 includes the regular word line predecoder CPD1 and a regular word line driver CDRV.

The comprehensive redundancy determination circuit CJD comprehensively determines whether each address is redundant or not based on the address redundancy match signal SAM and the input address signal SAD. Then, the comprehensive redundancy determination circuit CJD supplies an output signal SP1.

The erase processing circuit CER receives the output signal SP1 and an erase processing signal SER which instructs execution of special processing when data is erased from a memory cell. Based on these signals, the erase processing circuit CER executes the special processing at the time of data erase. Then, the erase processing circuit CER outputs a defective word line selection control signal S2R to the regular word line predecoder CPD1, and supplies an output signal SP2 to the forcible redundant word line selection control circuit CAR.

The special processing at the time of data erase performed by the erase processing circuit CER will be briefly described with a nonvolatile semiconductor memory device, more specifically, a flash EEPROM, used as an example.

In a flash EEPROM referred to as an NOR, a plurality of memory cells are connected to one bit line. Data stored in the memory cells is generally erased in units of a memory block which includes a plurality of memory cells. Data erase is specifically performed as follows.

Before erasing data, data write is performed to all the memory cells in the memory block which is the target of data erase. (This data write operation will be referred to as "preprogramming", hereinafter.) Preprogramming is performed in order to prevent excessive erase of data and thus obtain reliability. If the preprogramming is performed with a defective word line being replaced with a redundant word line and then data erase proceeds, there is a high risk that data in memory cells connected to this redundant word line is excessively erased. The data in these memory cells on the bit line cannot be accurately read since the memory cell generates an electric current despite the fact that no voltage is applied to the defective word line. In order to prevent such an inconvenience, the defective word line also is forcibly accessed during the performance of the preprogramming. Specifically, with the precondition that two defective word lines are shortcircuited with a foreign object, the preprogramming is performed with the two defective word lines being selected. Usually, a word line decoder drives only one word line, but in the preprogramming, the erase processing signal SER is generated such that the two adjacent defective word lines are both selected.

Accordingly, the erase processing circuit CER outputs a defective word line selection control signal S2R to the regular word line predecoder CPD1, and supplies an output signal SP2 to the forcible redundant word line selection control circuit CAR.

The forcible redundant word line selection control circuit CAR is used at the time of testing or during the execution of the preprogramming performed before data erase. The forcible redundant word line selection control circuit CAR has a function of forcibly accessing a redundant word line WLRED. The forcible redundant word line selection control circuit CAR receives a forcible redundant word line selection signal SRA which instructs forcible access to the redundant word line WLRED at the time of testing or the like, and outputs a redundant word line selection signal SRED based on the forcible redundant word line selection signal SRA and an input address signal SAD to the redundant word line driver CRDRV1. The forcible redundant word line selection control circuit CAR also outputs a redundant match signal SMAD to the regular word line predecoder CPD1. Based on the redundant word line selection signal SRED, the redundant word line driver CRDRV1 drives the redundant word line WLRED connected to a redundant memory cell in the redundant memory cell array MRD.

The regular word line predecoder CPD1 outputs a regular word line selection signal SREG to the regular word line driver CDRV based on the input address signal SAD, the defective word line selection control signal S2R, and the redundant match signal SMAD. Based on the regular word line selection signal SREG, the regular word line driver CDRV drives the redundant word line WLREG connected to a regular memory cell in the regular memory cell array MRG.

An operation of the regular and redundant word line control circuit CXDEC1 having the above-described structure will be described.

Data is read from a memory cell in the following manner. First, the input address signal SAD input to the semiconductor memory device 100 (FIG. 4) and the address redundancy match signal SAM (as a determination signal regarding each input address signal SAD) are input to the comprehensive redundancy determination circuit CJD.

The comprehensive redundancy determination circuit CJD determines whether a word line to be selected is defective or not. The input address signal SAD is also input to the regular word line predecoder CPD1. The input address signal SAD is input to the forcible redundant word line selection control circuit CAR used at the time of testing or the like.

When the comprehensive redundancy determination circuit CJD determines that the input address signal SAD represents a defective word line, the comprehensive redundancy determination circuit CJD supplies an output signal SP1 at the power supply level (hereinafter, referred to as the "HIGH level") to the erase processing circuit CER. The output signal SP1 at the HIGH level represents that a redundant word line is selected.

Since the memory operation in this case is data read, the erase processing circuit CER performs no processing (i.e., the defective word line selection control signal S2R is not issued), and information represented by the output signal SP1 is transmitted to the next-stage output signal SP2 with no change.

As described briefly above, the forcible redundant word line selection control circuit CAR which receives the output signal SP2 only acts at the time of testing or during the execution of the preprogramming performed before data erase. Therefore, the information represented by the output signal SP2 is output to the redundant word line drivers CRDRV1 as the redundant word line selection signal SRED with no change.

At this point, the redundant word line driver CRDRV1 selects a redundant word line WLRED. Therefore, the regular word line selection signal SREG needs to be at the ground level (hereinafter, referred to as the "LOW level"). The redundant match signal SMAD is turned to the HIGH level and is output to the regular word line predecoder CPD1, thereby placing the regular word line predecoder CPD1 into an unselectable state (selection stop state).

By contrast, when the comprehensive redundancy determination circuit CJD determines that the input address signal SAD does not represents a defective word line (i.e., that the word line to be selected is not defective), the comprehensive redundancy determination circuit CJD does not supply an output signal SP1 at the HIGH level. Namely, the output signal SP1 output by the comprehensive redundancy determination circuit CJD is at the LOW level. Since the erase processing circuit CER performs no processing when the memory operation is data read, the output signal SP2 from the erase processing circuit CER is at the LOW level, like the output signal SP1. The output signal SP2 is input to the forcible redundant word line selection control circuit CAR, but the forcible redundant word line selection signal SRA is not issued during data read. Accordingly, the redundant word line selection signal SRED and the redundant match signal SMAD are both at the LOW level, and therefore no redundant word line WLRED is driven.

As described above, the input address signal SAD is also input to the regular word line predecoder CPD1. Since the redundant match signal SMAD is at the LOW level, the regular word line predecoder CPD1, as well as the redundant word line control circuit, decodes the input address signal SAD and outputs the regular word line selection signal SREG to the regular word line driver CDRV. Thus, the regular word line predecoder CPD1 causes the regular word line driver CDRV to drive a desired regular word line WLREG.

The above-described operation of the regular and redundant word line control circuit CXDEC1 is the same for data write.

Data is erased from a memory cell in the following manner. In the following description, attention is paid to the execution of preprogramming performed before data erase for preventing excessive erase of data. In the preprogramming, the potentials of the word lines in the selected memory block are sequentially raised so as to perform data write. At this point, the erase processing signal SER which is input to the erase processing circuit CER is at the HIGH level. If the comprehensive redundancy determination circuit CJD determines that the word line accessed is defective and outputs the output signal SP1 at the HIGH level, the erase processing circuit CER outputs the defective word line selection control signal S2R to the regular word line predecoder CPD1, such that the defective word line accessed and the adjacent defective word line shortcircuited therewith are both accessed (i.e., such that these word lines are both selected). Upon receiving the signal S2R, the regular word line predecoder CPD1 outputs the regular word line selection signal SREG to the regular word line driver CDRV and thus raises the potentials of the two defective word lines.

The defective word line selection control signal S2R is at the HIGH level only while the defective word lines are selected, and is at the LOW level while a normal, regular word line is selected.

After the execution of the preprogramming for the regular word lines is completed, the redundant word lines are sequentially selected and the preprogramming is executed in the same manner. The redundant word lines are forcibly selected regardless of whether the redundant word lines replace defective word lines or not.

More specifically, the forcible redundant word line selection signal SRA is turned to the HIGH level, and the forcible redundant word line selection control circuit CAR receives the input address signal SAD and thus outputs the redundant word line selection signal SRED to the redundant word line drivers CRDRV1. Thus, the potentials of the redundant word lines WLRED are raised.

At this point, the redundant match signal SMAD is at the HIGH level. Accordingly, the regular word line predecoder CPD1 is in an unselectable state, and the regular word line selection signal SREG and the regular word lines WLREG are both at the LOW level.

FIG. 6 is a block diagram illustrating a partial structure of a regular and redundant word line selection circuit of a semiconductor memory device described in Japanese Laid-Open Publication No. 6-5093.

As shown in FIG. 6, the regular and redundant word line selection circuit includes a plurality of delay circuits 58 arranged in parallel in a word line selection path for selecting a regular word line 56. A delay time caused by the delay circuits 58 is set to be equal to a delay time caused by a redundant program circuit 51, i.e., equal to a defective address detection time in the redundant circuit system.

An operation of the regular and redundant word line selection circuit shown in FIG. 6 will be described.

For selecting a regular word line 56, an address data signal 50 is input to a decoder buffer 53a via the delay circuit 58, and a regular local decoder 53b raises the potential of a desired word line 56.

For selecting a redundant word line 57, the address data signal 50 is input to the decoder buffer 53a via the redundant program circuit 51.

The delay time of the delay circuit 58 and the delay time of the redundant program circuit 51 are equal to each other. Therefore, the regular word line 56 is driven at the same timing as the redundant word line 57 is driven instead of the regular word line 56. As a result, the memory cells are driven at the same timing via the regular word line selection path and via the redundant word line selection path.

In the case of selecting the redundant word line 57, when the input address data signal 50 for selecting the redundant word line 57 is hit in the redundant program circuit 51, the redundant program circuit 51 outputs a defective detection signal NEDR 52. The defective detection signal NEDR 52 is input to a redundant local decoder 54, and the redundant local decoder 54 raises the potential of the redundant word line 57 in a redundant memory cell 55. The defective detection signal NEDR 52 is also input to the regular local decoder 53b via the decoder buffer 53a, and disables (places into an unselectable state) a regular word line 56 having a defective bit. This regular word line 56 is kept disabled after the regular local decoder 53b and is not selected. As a result, only correct data from the redundant memory cell 55 is output to the bit line.

According to the technology described in Japanese Laid-Open Publication No. 6-5093, the delay time caused by the delay circuit 58 and the delay time caused by the redundant program circuit 51 are equal to each other. Therefore, the timing of driving a regular word line 56 is the same regardless of whether the redundant word line selection system is used or the not.

However, in the case where, as shown in FIG. 5, the erase processing circuit CER and the forcible redundant word line selection control circuit CAR which do not operate during memory read exist in an output path of the redundant match signal SMAD and the redundant word line selection signal SRED, the transmission of the signals SMAD and SRED is delayed since these signals are forced to pass through these extra logical circuits. In this case, the driving of the redundant word line WLRED is delayed with respect to the driving of the regular word line WLREG, which prevents improvement in the speed of data read.

According to the technology of Japanese Laid-Open Publication No. 6-5093, as shown in FIG. 6, the delay circuits 58 providing a delay time equal to the delay time caused by the redundant program circuit 51 are located in the word line selection path for selecting a regular word line 56. With such a structure, the timing of driving the regular word line 56 is matched to the timing of driving the redundant word line 57, so that the operation timing of a sense amplifier is adjusted. Although this provides a sufficient sense margin, this structure merely delays the driving of the regular word line 56. The structure shown in FIG. 6 does not improve the speed of data read.

SUMMARY OF THE INVENTION

According to one aspect of the invention, in a semiconductor memory device, a redundant memory cell is accessible based on an input address signal by a redundant word line selection signal which is output in accordance with whether data read is to be performed or a memory operation other than data read is to be performed.

According to another aspect of the invention, a semiconductor memory device includes a regular word line selection circuit for accessing a regular memory cell based on an input address signal; and a redundant word line selection circuit for accessing a redundant memory cell based on the input address signal and a defective address signal. The redundant word line selection circuit outputs a redundant word line selection signal in accordance with the type of memory operation so as to access the redundant memory cell.

In one embodiment of the invention, the redundant word line selection circuit outputs a first redundant word line selection signal when the memory operation is data read, and outputs a second redundant word line selection signal when the memory operation is an operation other than data read.

In one embodiment of the invention, the redundant word line selection circuit includes a read control circuit for outputting the first redundant word line selection signal when the memory operation is data read, and a non-read control circuit for outputting the second redundant word line selection signal when the memory operation is an operation other than data read.

In one embodiment of the invention, the read control circuit is driven by an input control signal which represents that the semiconductor memory device is in a data readable state, and the non-read control circuit is stopped by the input control signal.

In one embodiment of the invention, the redundant word line selection circuit outputs a redundancy determination signal to the regular word line selection circuit when an input address represented by the input address signal matches a defective address represented by the defective address signal.

In one embodiment of the invention, the redundant word line selection circuit outputs the redundancy determination signal as a first redundancy determination signal to the regular word line selection circuit when the memory operation is data read, and outputs the redundancy determination signal as a second redundancy determination signal to the regular word line selection circuit when the memory operation is an operation other than data read.

In one embodiment of the invention, the redundant word line selection circuit includes a comprehensive redundancy determination circuit for, when an input address represented by the input address signal matches a defective address represented by the defective address signal, outputting a determination signal which represents whether a defective word line corresponding to the defective address is to be replaced with a redundant word line, the read control circuit, and a redundant word line driver circuit for selectively driving a prescribed redundant word line based on a redundant word line selection signal from the read control circuit or the non-read control circuit. The non-read control circuit includes an erase processing circuit for performing data erase at the time of data erase, and a forcible redundant word line selection control circuit for outputting the second redundant word line selection signal upon receipt of an output from the erase processing circuit at the time of an operation other than data read.

In one embodiment of the invention, the redundant word line driver circuit selectively drives a prescribed redundant word line based on the first redundant word line selection signal which is input thereto during data read or based on the second redundant word line selection signal which is input thereto during an operation other than data read.

In one embodiment of the invention, the read control circuit outputs the first redundant word line selection signal directly to the redundant word line driver circuit during data read.

According to still another aspect of the invention, an electronic information device uses one of the above-described semiconductor memory device to determine whether a selected word line is defective or not and optimize a path for selecting a redundant word line, in accordance with the type of memory operation and thus to shorten an access time to a memory cell.

The above structure of the present invention will be specifically described with reference to FIG. 2. A semiconductor memory device according to the present invention includes a circuit system for selecting a redundant word line. In the circuit system, a comprehensive redundancy determination circuit CJD receives an input address signal SAD and an address redundancy match signal SAM, and supplies an output signal SP1. An erase processing circuit CER receives the output signal SP1 and supplies an output signal SP2, which is sent to a forcible redundant word line selection control circuit CAR. The forcible redundant word line selection control circuit CAR is controlled by a read access signal SRDAC so as not to operate. The read access signal SRDAC, when at the HIGH level, represents that the semiconductor memory device is in a data readable state. The forcible redundant word line selection control circuit CAR outputs a second redundant word line selection signal SRED2 to a redundant word line driver CRDRV2, and also outputs a redundant match signal SMAD2 (second redundancy determination signal) to a regular word line predecoder CPD2. The output signal SP1 from the comprehensive redundancy determination circuit CJD is also output to a read control circuit CRDC which is operated only during data read by the read access signal SRDAC. The read control circuit CRDC outputs a first redundant word line selection signals SRED1 to the redundant word line driver CRDRV2, and outputs a redundant match signal SMAD1 (first redundancy determination signal) to the regular word line predecoder CPD2.

As the redundant word line driver CRDRV2 for driving a redundant word line WLRED upon receipt of an output signal from a redundant word line control circuit CXDEC2, an inverter-type redundant word line driver CRDRV21 shown in FIG. 3A is usable. The inverter-type redundant word line driver CRDRV21 includes a p-type transistor P0, n-type transistors N0, N1 and N2, and a word line drive inverter DRV. A power supply of the word line drive inverter DRV and a source of the p-type transistor P0 are connected to a word line power supply HWL. A gate of the p-type transistor P0 is grounded. A node (control gate) SX0 of the word line drive inverter DRV is connected to a drain of the p-type transistor P0 and is also connected to drains of the n-type transistors N0 and N2. Sources of the n-type transistors N0 and N2 are connected to a drain of the n-type transistor N1. A source of the n-type transistor N1 is grounded. Gates of then-type transistors N0, N1 and N2 are respectively supplied with a first redundant word line selection signal SRED1 output from the read control circuit CRDC, a memory block selection signal SBLK, and a second redundant word line selection signal SRED2 output from the forcible redundant word line selection control circuit CAR.

The inverter-type redundant word line driver CRDRV21 sets the p-type transistor P0 to have a high resistance. Another type of redundant word line driver usable as the redundant word line driver CRDRV2 is a latch-type redundant word line driver CRDRV22 shown in FIG. 3B.

The latch-type redundant word line driver CRDRV22 includes p-type transistors P0 and P1, n-type transistors N0, N1, N2 and N3, a logic circuit C0 and a word line drive inverter DRV. The power supply of the word line drive inverter DRV and the sources of the p-type transistors P0 and P1 are connected to the word line power supply HWL. A drain of the p-type transistor P0, a gate of the p-type transistor P1 and a drain of the n-type transistor N3 are connected to a node SX1. A node (control gate) SX0 of the word line drive inverter DRV is connected to a drain of the p-type transistor P1, agate of the p-type transistor P0, and drains of the n-type transistors N0 and N2. Sources of the n-type transistors N0 and N2 are connected to a drain of the n-type transistor N1, and a source of the n-type transistor N1 is grounded. A gate of the n-type transistor N3 is connected to an output end of the logic circuit C0. Gates of the n-type transistors N0, N1 and N2 are respectively supplied with the first redundant word line selection signal SRED1 output from the read control circuit CRDC, the memory block selection signal SBLK, and the second redundant word line selection signal SRED2 output from the forcible redundant word line selection control circuit CAR. An input end of the logic circuit C0 is also supplied with the first redundant word line selection signal SRED1 output from the read control circuit CRDC, the second redundant word line selection signal SRED2 output from the forcible redundant word line selection control circuit CAR, and the memory block selection signal SBLK.

The function of the present invention having the above-described structure will be described.

Conventionally, a redundant word line selection circuit outputs a redundant word line selection signal regardless of whether the memory operation is data read, data write or data erase. According to the present invention, the circuit system is structured so as to have a part used for data read and a part for operations other than data read, i.e., data write and erase. Thus, it is determined whether the selected word line is defective or not and a path for selecting a redundant word line is optimized in accordance with whether the memory operation to be performed is data read, or data write or erase. In this state, a redundant word line selection signal is output. Accordingly, a redundant word line selection signal is directly supplied from the read control circuit to the redundant word line driver. Signals used for data read need not pass through circuits used for data write and erase. Therefore, even when a redundant word line is selected, a control signal for raising the potential of the selected redundant word line is not unnecessarily delayed. Thus, the timing for selecting a redundant memory cell is prevented from being delayed. Therefore, the memory cells can be accessed at the same timing regardless of whether a redundant word line is selected or a regular word line is selected.

Thus, the invention described herein makes possible the advantages of providing a semiconductor memory device for determining whether the selected word line is defective or not and optimizing a path for selecting a redundant word line, in accordance with the type of memory operation, so as to shorten an access time to a memory cell and thus prevent the selection timing of the memory cell from being delayed even when a redundant circuit is used, and an electronic information device using such a semiconductor memory device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
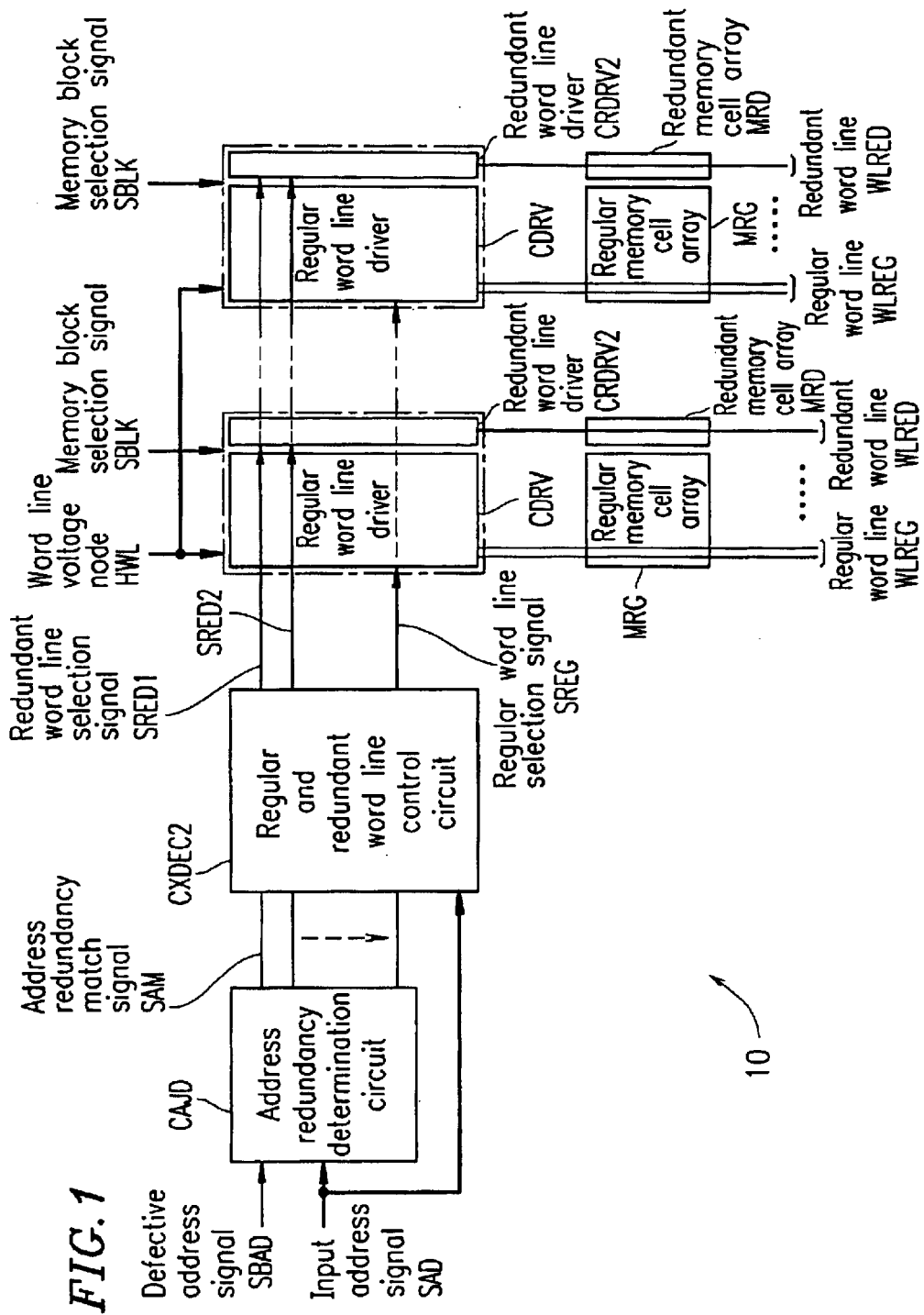
FIG. 1 is a block diagram illustrating a partial structure of a semiconductor memory device according to the present invention, specifically a regular and redundant word line selection control system of the semiconductor memory device.
Figure 2:
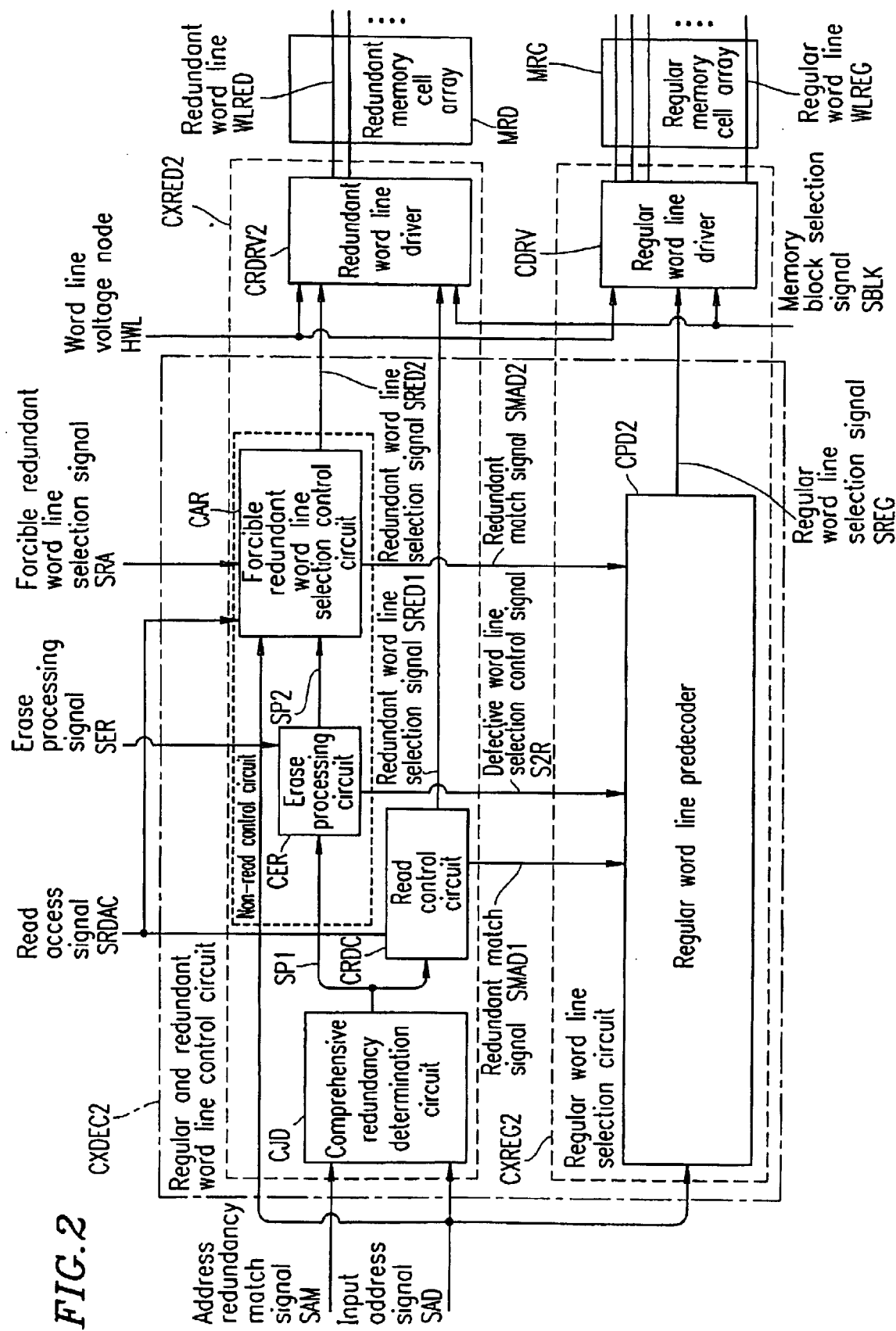
FIG. 2 is a block diagram illustrating a partial structure of a regular and redundant word line control circuit in the semiconductor memory device shown in FIG. 1.
Figure 4:
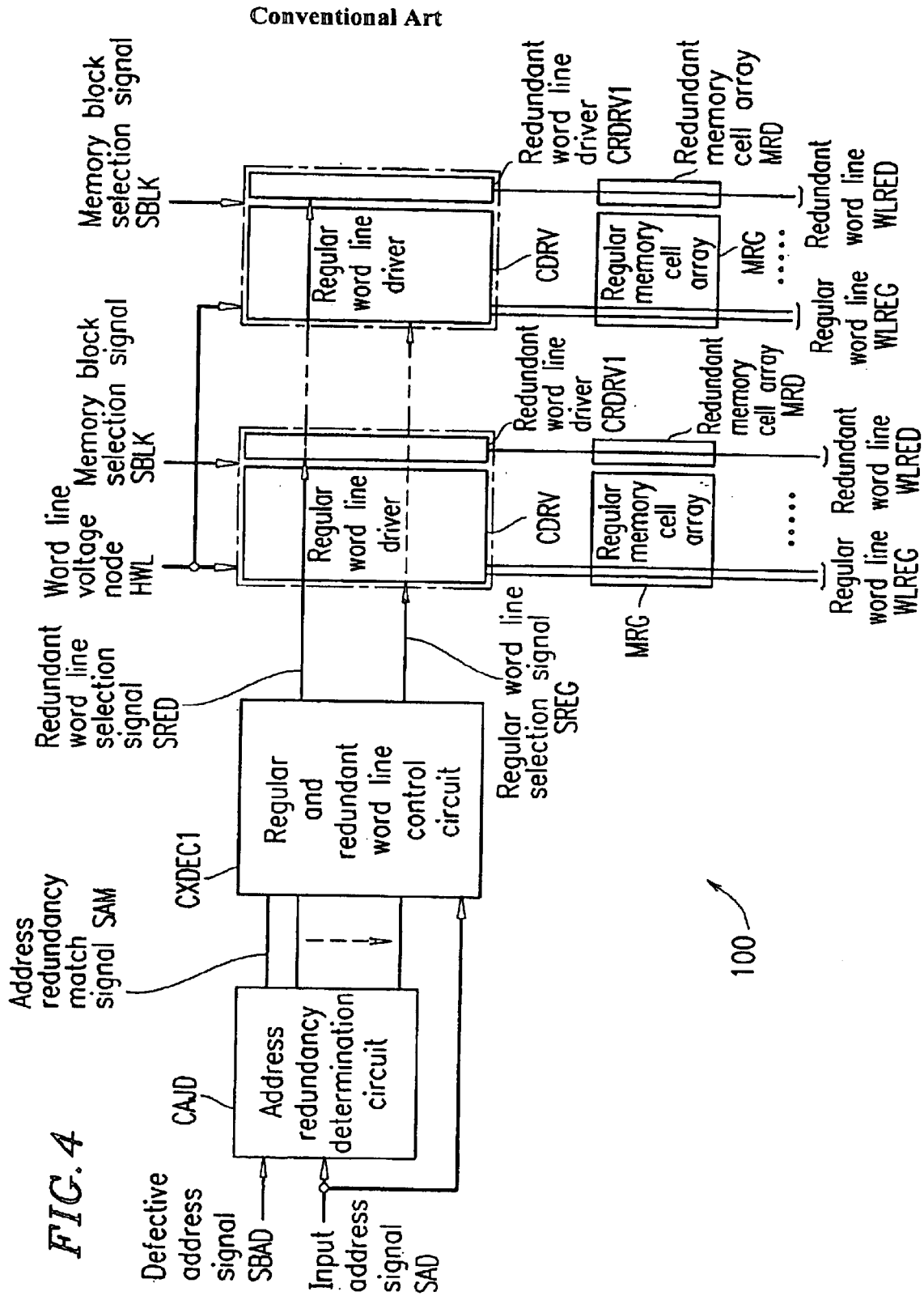
FIG. 4 is a block diagram illustrating a partial structure of a conventional semiconductor memory device, specifically a regular and redundant word line selection control system of the conventional semiconductor memory device.
Figure 5:
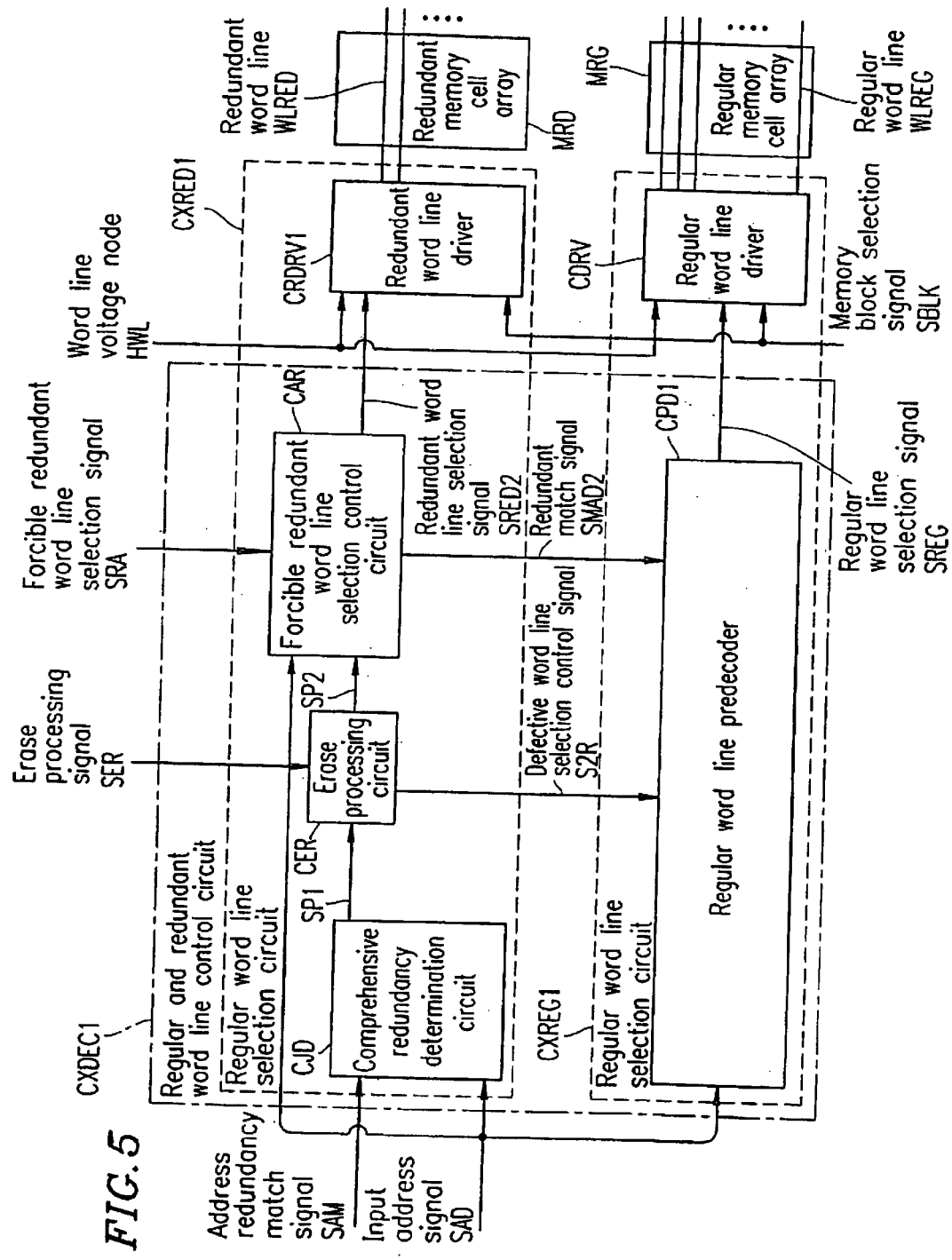
FIG. 5 is a block diagram illustrating a partial structure of a regular and redundant word line control circuit in the conventional semiconductor memory device shown in FIG. 4.
Figure 6:
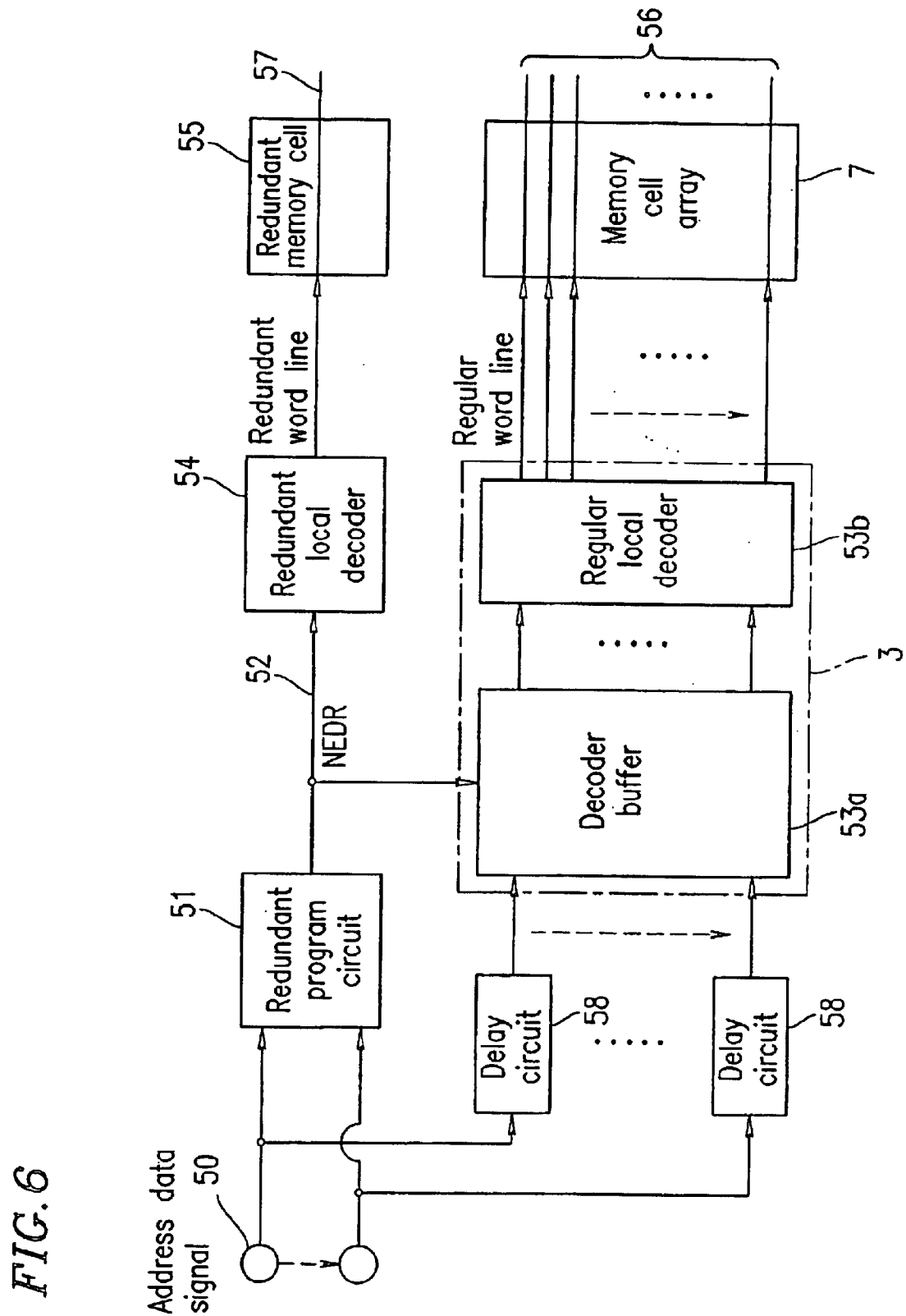
FIG. 6 is a block diagram illustrating a partial structure of a regular and redundant word line selection circuit of another conventional semiconductor memory device.

With reference to FIGS. 1 through 3, a semiconductor memory device 10 according to one example of the present invention will be described. Identical elements previously discussed with respect to FIGS. 4 through 6 bear identical reference numerals and the detailed descriptions thereof will be omitted.

FIG. 1 is a block diagram illustrating a partial structure of the semiconductor memory device 10.

As shown in FIG. 1, the semiconductor memory device 10 includes an address redundancy determination circuit CAJD, a regular and redundant word line control circuit CXDEC2, a plurality of regular memory cell arrays MRG, a plurality of redundant memory cell arrays MRD, a plurality of regular word line drivers CDRV, and a plurality of redundant word line drivers CRDRV2.

The address redundancy determination circuit CAJD determines whether an input address signal SAD and a defective address signal SBAD match each other and outputs an address redundancy match signal SAM as an output determination signal (for example, a defective word line determination signal) which represents the determination result for each address. When the input address signal SAD and the defective address signal SBAD match each other, the level of the address redundancy match signal SAM is HIGH. When the input address signal SAD and the defective address signal SBAD do not match each other, the level of the address redundancy match signal SAM is LOW.

Based on the input address signal SAD and the address redundancy match signal SAM, the regular and redundant word line control circuit CXDEC2 outputs either the regular word line selection signal SREG or first and second redundant word line selection signals SRED1 and SRED2. More specifically, when the address redundancy match signal SAM is at the HIGH level, the regular and redundant word line control circuit CXDEC2 outputs the first redundant word line selection signal SRED1 and the second redundant word line selection signal SRED2. When the address redundancy match signal SAM is at the LOW level, the regular and redundant word line control circuit CXDEC2 outputs the regular word line selection signal SREG.

The semiconductor memory device 10 (FIG. 1) includes a plurality of memory cell array areas referred to as memory blocks. Each memory cell array area includes a plurality of regular memory cell arrays MRG and a plurality of redundant memory cell arrays MRD. Each regular memory cell array MRG includes a plurality of memory cells, and each redundant memory cell array MRD includes a plurality of memory cells. Memory operations including data write to a plurality of prescribed memory cells corresponding to an input address signal SAD and data read and erase from the plurality of memory cells can be performed.

Each memory cell array area includes one regular word line driver CDRV and one redundant word line driver CRDRV2. In order to perform the above-described memory operations, each regular word line driver CDRV selects a regular word line corresponding to the input address signal SAD, or each redundant word line driver CRDRV2 selects a redundant word line corresponding to the input address signal SAD.

With the above-described structure, an input address signal SAD having a plurality of bits is input to the regular and redundant word line control circuit CXDEC2 and also to the address redundancy determination circuit CAJD.

The address redundancy determination circuit CAJD receives a defective address signal SBAD as well as the input address signal SAD, and determines whether the input address signal SAD matches the defective address signal SBAD or not.

As described above, when the input address signal SAD and the defective address signal SBAD match each other, the level of the address redundancy match signal SAM (as a determination signal regarding each input address signal SAD) is HIGH. When the input address signal SAD and the defective address signal SBAD do not match each other, the level of the address redundancy match signal SAM is LOW. The address redundancy match signal SAM is output from the address redundancy determination circuit CAJD to the regular and redundant word line control circuit CXDEC2.

Based on the input address signal SAD and the address redundancy match signal SAM, the regular and redundant word line control circuit CXDEC2 outputs either the regular word line selection signal SREG or the first and second redundant word line selection signals SRED1 and SRED2. The output word line selection signal is output to the regular word line driver CDRV or the redundant word line driver CRDRV2.

In a selected memory block (memory block selection signal SBLK is HIGH), the regular word line driver CDRV or the redundant word line driver CRDRV2 is activated, and a desired regular memory cell array MRG or a desired redundant memory cell array MRD is selected. This selection is performed by raising the potential of a regular word line WLREG corresponding to the desired regular memory cell array MRG or the potential of a redundant word line WLRED corresponding to the desired redundant memory cell array MRD. In this manner, memory operations including data write to, data read from, or data erase from a memory cell corresponding to the input address signal SAD are performed.

FIG. 2 is a block diagram illustrating a partial structure of a regular and redundant word line selection circuit including the regular and redundant word line control circuit CXDEC2.

As shown in FIG. 2, the regular and redundant word line control circuit CXDEC2 includes a comprehensive redundancy determination circuit CJD, a read control circuit CRDC, an erase processing circuit CER as a circuit for controlling the memory operations other than data read, for example, data erase (also referred to as a "non-read control circuit"), a forcible redundant word line selection control circuit CAR, a redundant word line driver CRDRV2, a regular word line predecoder CPD2, and a regular word line driver CDRV. A redundant word line selection circuit CXRED2 includes the comprehensive redundancy determination circuit CJD, the read control circuit CRDC, the erase processing circuit CER, the forcible redundant word line selection control circuit CAR, and the redundant word line driver CRDRV2. A regular word line selection circuit CXREG2 includes the regular word line predecoder CPD2 and regular word line driver CDRV.

The comprehensive redundancy determination circuit CJD comprehensively determines whether each address is redundant or not based on the address redundancy match signal SAM and the input address signal SAD. Then, the comprehensive redundancy determination circuit CJD supplies an output signal SP1.

The read control circuit CRDC receives the output signal SP1 from the comprehensive redundancy determination circuit CJD, and also receives a read access signal SRDAC which represents that the semiconductor memory device 10 (FIG. 1) is in a data readable state. The read control circuit CRDC functions only during data read. The read control circuit CRDC outputs the first redundant word line selection signal SRED1 to the redundant word line driver CRDRV2 such that the redundant word line WLRED is driven. The read control circuit CRDC also outputs a redundant match signal SMAD1 as a first redundancy determination signal to the regular word line predecoder CPD2.

The erase processing circuit CER receives the output signal SP1 and an erase processing signal SER which instructs execution of special processing when data is erased from a memory cell. Based on these signals, the erase processing circuit CER executes the special processing at the time of erasing. Then, the erase processing circuit CER outputs a defective word line selection control signal S2R to the regular word line predecoder CPD2, and supplies an output signal SP2 to the forcible redundant word line selection control circuit CAR.

The forcible redundant word line selection control circuit CAR is used at the time of testing or during the execution of the preprogramming performed before data erase. The forcible redundant word line selection control circuit CAR has a function of forcibly accessing a redundant word line WLRED. The forcible redundant word line selection control circuit CAR receives a forcible redundant word line selection signal SRA which instructs forcible access to the redundant word line WLRED at the time of testing or the like, and outputs a second redundant word line selection signal SRED2 based on the forcible redundant word line selection signal SRA and an input address signal SAD to the redundant word line driver CRDRV2. The forcible redundant word line selection control circuit CAR also outputs a redundant match signal SMAD2 as a second redundancy determination signal to the regular word line predecoder CPD2. Based on the redundant word line selection signal SRED2, the redundant word line driver CRDRV2 drives the redundant word line WLRED connected to a redundant memory cell in the redundant memory cell array MRD.

The forcible redundant word line selection control circuit CAR also receives the read access signal SRDAC which represents that the semiconductor memory device 10 (FIG. 1) is in a data readable state. The forcible redundant word line selection control circuit CAR does not function when the semiconductor memory device 10 is in a data readable state, and only operates during data write, data read and at the time of testing.

The regular word line predecoder CPD2 outputs a regular word line selection signal SREG to the regular word line driver CDRV based on the input address signal SAD, the defective word line selection control signal S2R, and the redundant match signals SMAD1 and SMAD2. Based on the regular word line selection signal SREG, the regular word line driver CDRV drives the regular word line WLREG connected to a regular memory cell in the regular memory cell array MRG.

An operation of the regular and redundant word line control circuit CXDEC2 will be described.

First, the operation for performing data read (i.e., when the read access signal SRDAC is at the power supply level or the HIGH level) will be described, both in the case where a redundant word line WLRED is selected and in the case where a redundant word line WLRED is not selected.

The input address signal SAD input to the semiconductor memory device 10 (FIG. 1) and the address redundancy match signal SAM (as a determination signal regarding each input address signal SAD) are input to the comprehensive redundancy determination circuit CJD.

The comprehensive redundancy determination circuit CJD determines whether a word line to be selected is defective or not. The input address signal SAD is also input to the regular word line predecoder CPD2. The input address signal SAD is input to the forcible redundant word line selection control circuit CAR used at the time of testing or the like.

When the comprehensive redundancy determination circuit CJD determines that the input address signal SAD represents a defective word line, the comprehensive redundancy determination circuit CJD supplies an output signal SP1 at the HIGH level to the read control circuit CRDC and the erase processing circuit CER. The output signal SP1 at the HIGH level represents that a redundant word line is selected; i.e., a defective word line corresponding to the defective address is to be replaced with a redundant word line.

Since the memory operation in this case is data read, the erase processing circuit CER performs no processing (i.e., the defective word line selection control signal S2R is not issued), and information represented by the output signal SP1 is transmitted to the next-stage output signal SP2 with no change.

However, since the read access signal SRDAC is at the HIGH level and thus represents that the semiconductor memory device 10 (FIG. 1) is in a data readable state, the forcible redundant word line selection control circuit CAR which receives the output signal SP2 does not operate. In other words, in whichever state the output signal SP2 may be, the second redundant word line selection signal SRED2 (as the second redundant word line selection signal) and the redundant match signal SMAD2 are at the ground level or the LOW level.

Since the read access signal SRDAC is at the HIGH level, the read control circuit CRDC is in an operable state. When the comprehensive redundancy determination circuit CJD determines that the input address signal SAD represents a defective word line, the read control circuit CRDC outputs the first redundant word line selection signal SRED1 at the HIGH level to the redundant word line driver CRDRV2. Thus, the read control circuit CRDC causes the redundant word line driver CRDRV2 to drive a desired redundant word line WLRED. The regular word line selection signal SREG needs to be at the LOW level. For this purpose, the read control circuit CRDC outputs the redundant match signal SMAD1 at the HIGH level to the regular word line predecoder CPD2 so as to place the regular word line predecoder CPD2 into an unselectable state (selection stop state).

By contrast, when the comprehensive redundancy determination circuit CJD determines that the word line to be selected is not defective, the comprehensive redundancy determination circuit CJD does not supply an output signal SP1 at the HIGH level. Namely, the output signal SP1 output by the comprehensive redundancy determination circuit CJD is at the LOW level. Since the erase processing circuit CER performs no processing when the memory operation is data read, the output signal SP2 from the erase processing circuit CER is at the LOW level like the output signal SP1.

The output signal SP2 is input to the forcible redundant word line selection control circuit CAR, but the read access signal SRDAC is at the LOW level during data read. Accordingly, the forcible redundant word line selection control circuit CAR does not operate, and the redundant word line selection signal SRED2 and the redundant match signal SMAD2 which are output from the forcible redundant word line selection control circuit CAR are both at the LOW level.

The read control circuit CRDC functions since the read access signal SRDAC is at the HIGH level. However, when the word line to be selected is not determined to be defective, the output signal SP1 is at the LOW level and thus does not represent that a redundant word line WLRED is selected. Therefore, the redundant match signal SMAD1 and the redundant word line selection signal SRED1 which are output from the read control circuit CRDC are both at the LOW level. No redundant word line WLRED is selected.

As described above, the input address signal SAD is also input to the regular word line predecoder CPD2. Since the redundant match signals SMAD1 and SMAD2 are at the LOW level, the regular word line predecoder CPD2, as well as the redundant word line control circuit, decodes the input address signal SAD and outputs the regular word line selection signal SREG to the regular word line driver CDRV. Thus, the regular word line predecoder CPD2 causes the regular word line driver CDRV to drive a desired regular word line WLREG.

In this manner, when a redundant word line WLRED is selected for data read, the first redundant word line selection signal SRED1 is obtained from the read control circuit CRDC which functions only during data read. Namely, the first redundant word line selection signal SRED1 is obtained after a determination selection path having only the functions required for data read (comprehensive redundancy determination circuit CJD and read control circuit CRDC). Unlike in the conventional structure (FIG. 5), the redundant word line WLRED is not driven by the redundant word line selection signal SRED obtained via the erase processing circuit CER and the forcible redundant word line selection control circuit CAR from the output signal SP1 which is output by the comprehensive redundancy determination circuit CJD. Owing to the structure shown in FIG. 2, the delay time can be shortened and thus the data read time can significantly be reduced, compared to the structure shown in FIG. 5.

Next, the operation of the regular and redundant word line control circuit CXDEC2 for memory operations other than data read (for example, the operation for performing data write and data erase) will be described, both in the case where a redundant word line WLRED is selected and in the case where a redundant word line WLRED is not selected.

First, the operation for performing data write to an arbitrary address will be described.

When the comprehensive redundancy determination circuit CJD determines that the input address signal SAD represents a defective word line, the comprehensive redundancy determination circuit CJD supplies an output signal SP1 at the HIGH level to the read control circuit CRDC and the erase processing circuit CER. The output signal SP1 at the HIGH level represents that a redundant word line is selected.

Since the memory operation in this case is data write, the erase processing circuit CER performs no processing (i.e., the defective word line selection control signal S2R is not issued), and information represented by the output signal SP1 is transmitted to the next-stage output signal SP2 with no change.

Since the read access signal SRDAC is at the LOW level and thus represents that the semiconductor memory device 10 (FIG. 1) is not in a data readable state, the read control circuit CRDC does not operate. In other words, in whichever state the output signal SP1 may be, the first redundant word line selection signal SRED1 and the redundant match signal SMAD1 from the read control circuit CRDC are at the ground level or the LOW level.

As described above, the forcible redundant word line selection control circuit CAR which receives the output signal SP2 from the erase processing circuit CER functions only at the time of testing and during the execution of the preprogramming performed before data erase. Therefore, the information represented by the output signal SP2 is output to the redundant word line driver CRDRV2 as the redundant word line selection signal SRED2 with no change. At this point, the redundant word line driver CRDRV2 selects a redundant word line WLRED. Therefore, the regular word line selection signal SREG needs to be disabled (placed into an unselectable state). The redundant match signal SMAD2 from the forcible redundant word line selection control circuit CAR is turned to the HIGH level and is output to the regular word line predecoder CPD2, thereby placing the regular word line predecoder CPD2 into the unselectable state.

By contrast, when the comprehensive redundancy determination circuit CJD determines that the word line to be selected is not defective, the comprehensive redundancy determination circuit CJD does not output an output signal SP1 at the HIGH level. Namely, the output signal SP1 output by the comprehensive redundancy determination circuit CJD is at the LOW level. Since the erase processing circuit CER performs no processing when the memory operation is data write, the output signal SP2 from the erase processing circuit CER is at the LOW level like the output signal SP1.

The output signal SP2 is input to the forcible redundant word line selection control circuit CAR, but the forcible redundant word line selection signal SRA is not issued during data write. Accordingly, the redundant word line selection signal SRED2 and the redundant match signal SMAD2 which are output from the forcible redundant word line selection control circuit CAR are both at the LOW level. Thus, no redundant word line WLRED is driven.

As described above, the input address signal SAD is also input to the regular word line predecoder CPD2. Since the redundant match signal SMAD1 is at the LOW level, the regular word line predecoder CPD2, as well as the redundant word line control circuit, decodes the input address signal SAD and outputs the regular word line selection signal SREG to the regular word line driver CDRV. Thus, the regular word line predecoder CPD2 causes the regular word line driver CDRV to drive a desired regular word line WLREG.

Next, the operation of the redundant word line selection circuit CXRED2 for performing data erase will be described. In the following description, attention is paid to the execution of preprogramming performed before data erase for preventing excessive erase of data. In the preprogramming, the potentials of the word lines in the selected memory block are sequentially raised so as to perform data write. At this point, the erase processing signal SER which is input to the erase processing circuit CER is at the HIGH level. If the comprehensive redundancy determination circuit CJD determines that the word line accessed is defective and outputs the output signal SP1 at the HIGH level, the erase processing circuit CER outputs the defective word line selection control signal S2R to the regular word line predecoder CPD2, such that the defective word line accessed and the adjacent defective word line shortcircuited therewith are both accessed (such that these word lines are both selected). Upon receiving the signal S2R, the regular word line predecoder CPD2 outputs the regular word line selection signal SREG to the regular word line driver CDRV and thus raises the potentials of the two defective word lines.

The defective word line selection control signal S2R is at the HIGH level only while the defective word lines are selected, and is at the LOW level while a normal, regular word line is selected. After the execution of the preprogramming for the regular word lines is completed, the redundant word lines are sequentially selected and the preprogramming is executed in the same manner. The redundant word lines are forcibly selected regardless of whether the redundant word lines replace defective word lines or not.

More specifically, the forcible redundant word line selection signal SRA is turned to the HIGH level, and the forcible redundant word line selection control circuit CAR receives the input address signal SAD and thus outputs the redundant word line selection signal SRED2 to the redundant word line driver CRDRV2. Thus, the potentials of the redundant word lines WLRED are raised. At this point, the redundant match signal SMAD2 is at the HIGH level. Accordingly, the regular word line predecoder CPD2 is in an unselectable state, and the regular word line selection signal SREG and the regular word lines WLREG are both at the LOW level.

So far, the structure and operation of the redundant word line selection circuit CXRED2, which uses different selection paths for data read and for data write and erase, have been described. Hereinafter, the structure and operation of the redundant word line driver CRDRV2 operating upon receipt of the output from the first or second redundant word line selection signal SRED1 or SRED2 will be described.

Figure 3A:
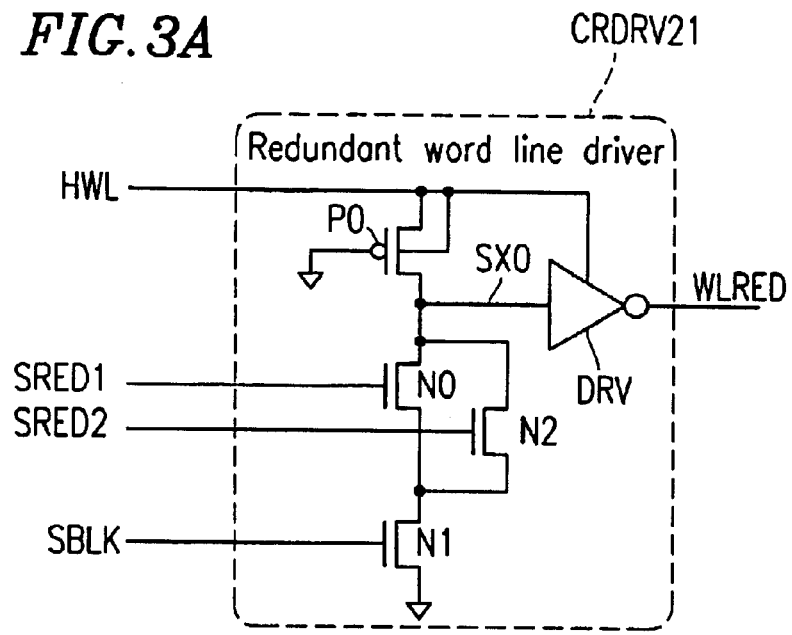
FIG. 3A is a circuit diagram illustrating an exemplary structure of an inverter-type redundant word line driver applicable to the present invention.

FIG. 3A is a circuit diagram illustrating an exemplary structure of an inverter-type redundant word line driver CRDRV21.

As shown in FIG. 3A, the inverter-type redundant word line driver CRDRV21 includes a word line drive inverter DRV, a p-type transistor P0, and n-type transistors N0 through N2.

A power supply of the word line drive inverter DRV and a source of the p-type transistor P0 are connected to a word line power supply HWL. A gate of the p-type transistor P0 is grounded. A node (control gate) SX0 of the word line drive inverter DRV is connected to a drain of the p-type transistor P0 and is also connected to the n-type transistors N0 and N2 in parallel. Sources of the n-type transistors N0 and N2 are connected to a drain of the n-type transistor N1. A source of the n-type transistor N1 is grounded. A gate of the n-type transistor N0 is supplied with a first redundant word line selection signal SRED1 output from the read control circuit CRDC (FIG. 2). A gate of the n-type transistor N2 is supplied with a second redundant word line selection signal SRED2 output from the forcible redundant word line selection control circuit CAR (FIG. 2). A gate of the n-type transistor N1 is supplied with a memory block selection signal SBLK.

The inverter-type redundant word line driver CRDRV21 sets the p-type transistor P0 to have a high resistance, and receives a word line power supply HWL, the first and second redundant word line selection signals SRED1 and SRED2, and the memory block selection signal SBLK. In the case where the first or second redundant word line selection signal SRED1 or SRED2 is turned to the HIGH level when the word line power supply HWL and the memory block selection signal SBLK are at the HIGH level, the word line drive inverter DRV outputs a HIGH selection signal for selecting a redundant word line WLRED.

An operation of the inverter-type redundant word line driver CRDRV21 having the above-described structure will be described when the semiconductor memory device 10 (FIG. 1) is in a data readable state.

When a memory block is selected, the memory block selection signal SBLK is turned to the HIGH level, thereby turning on the n-type transistor N1. In the case where the input address signal selects a defective word line, the read control circuit CRDC in the redundant word line selection circuit CXRED2 (FIG. 2) outputs the redundant word line selection signal SRED1 at the HIGH level. This turns on the n-type transistor N0 and grounds the node SX0. Then, the word line drive inverter DRV drives the redundant word line WLRED so as to have the voltage of the word line power supply HWL.

An operation of the inverter-type redundant word line driver CRDRV21 will be described when the semiconductor memory device 10 (FIG. 1) is in a data writable or erasable state.

When a memory block is selected, the memory block selection signal SBLK is turned to the HIGH level, thereby turning on the n-type transistor N1. In the case where the input address signal selects a defective word line, the forcible redundant word line selection control circuit CAR in the redundant word line selection circuit CXRED2 (FIG. 2) outputs the redundant word line selection signal SRED2 at the HIGH level. This turns on the n-type transistor N2 and grounds the node SX0. Then, as in the case of data read, the word line drive inverter DRV drives the redundant word line WLRED so as to have the voltage of the word line power supply HWL.

Figure 3B:
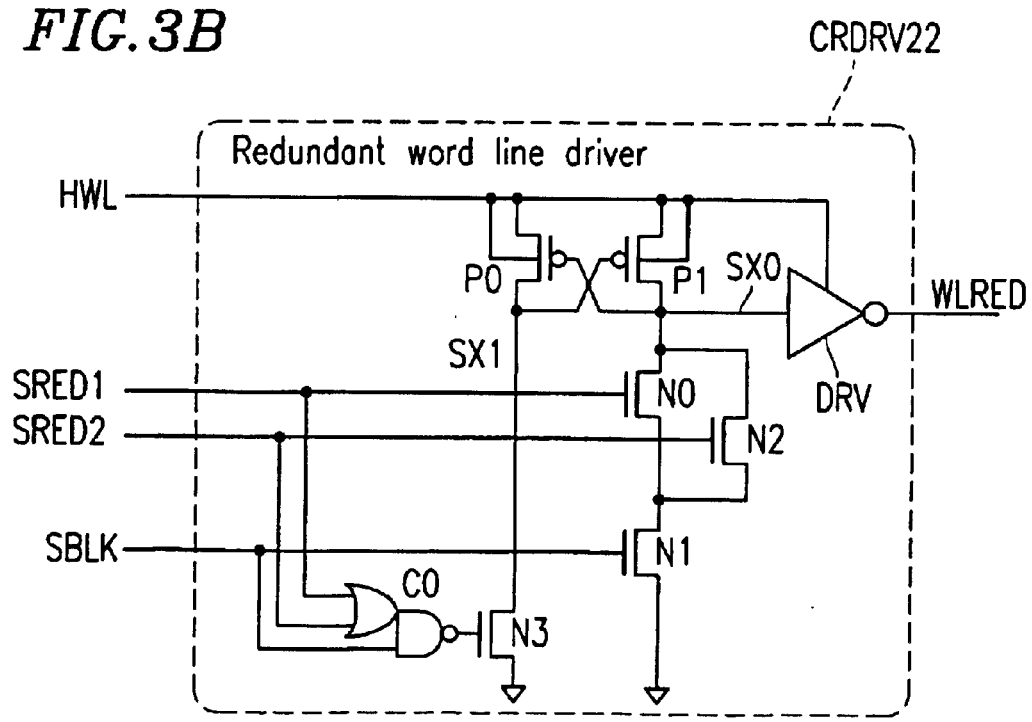
FIG. 3B is a circuit diagram illustrating an exemplary structure of a latch-type redundant word line driver applicable to the present invention.

FIG. 3B is a circuit diagram illustrating an exemplary structure of a latch-type redundant word line driver CRDRV22.

As shown in FIG. 3B, the latch-type redundant word line driver CRDRV22 includes a word line drive inverter DRV, p-type transistors P0 and P1, and n-type transistors N0 through N3.

The power supply of the word line drive inverter DRV and the sources of the p-type transistors P0 and P1 are connected to the word line power supply HWL. A drain of the p-type transistor P0, a gate of the p-type transistor P1 and a drain of the n-type transistor N3 are connected to a node SX1. A source of the n-type transistor N3 is grounded. A node (control gate) SX0 of the word line drive inverter DRV is connected to a drain of the p-type transistor P1, a gate of the p-type transistor P0, and drains of the n-type transistors N0 and N2. Sources of the n-type transistors N0 and N2 are connected to a drain of the n-type transistor N1, and a source of the n-type transistor N1 is grounded. A gate of the n-type transistor N0 is supplied with the first redundant word line selection signal SRED1 output from the read control circuit CRDC (FIG. 2). A gate of the n-type transistor N2 is supplied with the second redundant word line selection signal SRED2 output from the forcible redundant word line selection control circuit CAR (FIG. 2). A gate of the n-type transistor N1 is supplied with the memory block selection signal SBLK. A gate of the n-type transistor N3 is supplied with an output from a logic circuit C0 including an OR gate and a NAND gate. The OR gate receives first redundant word line selection signal SRED1 output from the read control circuit CRDC and the second redundant word line selection signal SRED2 output from the forcible redundant word line selection control circuit CAR. The NAND gate receives the output from the OR gate and the memory block selection signal SBLK.

An operation of the inverter-type redundant word line driver CRDRV22 having the above-described structure will be described when the semiconductor memory device 10 (FIG. 1) is in a data readable state.

When a memory block is selected, the memory block selection signal SBLK is turned to the HIGH level, thereby turning on the n-type transistor N1. In the case where the input address signal selects a defective word line, the read control circuit CRDC in the redundant word line selection circuit CXRED2 (FIG. 2) outputs the redundant word line selection signal SRED1 at the HIGH level. This turns on the n-type transistor N0 and grounds the node SX0. At this point, the p-type transistor P0 is turned on, thereby raising the potential of the node SX1 to the voltage of the word line power supply HWL. Then, the p-type transistor P1 is turned off. Simultaneously, the n-type transistor N3 is turned off by the action of the logic circuit C0. Then, the word line drive inverter DRV drives the redundant word line WLRED so as to have the voltage of the word line power supply HWL.

An operation of the inverter-type redundant word line driver CRDRV22 will be described when the semiconductor memory device 10 (FIG. 1) is in a data writable or erasable state.

When a memory block is selected, the memory block selection signal SBLK is turned to the HIGH level, thereby turning on the n-type transistor N1. In the case where the input address signal selects a defective word line, the forcible redundant word line selection control circuit CAR in the redundant word line selection circuit CXRED2 (FIG. 2) outputs the redundant word line selection signal SRED2 at the HIGH level. This turns on the n-type transistor N2 and grounds the node SX0. At this point, the p-type transistor P0 is turned on, thereby raising the potential of the node SX1 to the level of the word line power supply HWL. Then, as in the case of data read, the p-type transistor P1 is turned off. Simultaneously, the n-type transistor N3 is turned off by the action of the logic circuit C0. Then, as in the case of data read, the word line drive inverter DRV drives the redundant word line WLRED so as to have the voltage of the word line power supply HWL.

As described above, in this example, the plurality of redundant word line selection signals SRED1 and SRED2 are both input to the redundant word line driver CRDRV2 (FIG. 2). The inverter-type redundant word line driver CRDRV21 shown in FIG. 3A or the latch-type redundant word line driver CRDRV22 shown in FIG. 3B can be simply connected to the regular and redundant word line control circuit CXDEC2 and used as the redundant word line driver CRDRV2. Other types of word line drivers can also be used as the redundant word line driver CRDRV2.

As described above, the semiconductor memory device 10 according to the present invention includes a regular word line selection circuit CXREG2 (FIG. 2) for accessing a regular memory cell based on an input address signal SAD, and a redundant word line selection circuit CXRED2 for accessing a redundant word line based on the input address signal SAD and a defective address signal SBAD. The redundant word line selection signal CXRED2 includes a read control circuit CRDC for outputting a redundant word line selection signal SRED1 exclusive for data read, a non-read control circuit for outputting a redundant word line selection signal SRED2 exclusive for the operation other than data read, and a redundant word line driver CRDRV2 for accessing a prescribed redundant memory cell based on the redundant word line selection signal SRED1 or SRED2.

The read control circuit CRDC exclusive for data read is provided in an optimized state, such that when a redundant word line is selected, the redundant word line selection signal is directly supplied from the read control circuit CRDC to the redundant word line driver CRDRV2 to raise the potential of the selected redundant word line, without passing pass through a non-read control circuit. Owing to such a structure, the delay time caused by the non-read control circuit is shortened, and thus the potential of the selected redundant word line can be raised with substantially the same delay time as required for raising the potential of a selected regular word line. This also improves the access time for data read. By contrast, according to the technology described in Japanese Laid-Open Publication No. 6-5093, a delay circuit providing the same delay time as that caused by the redundancy determination circuit is located in the regular word line selection path. As a result, the timing at which the potential of the selected redundant word line matches the timing at which the potential of the selected regular word line. However, the access time for data is not shortened.

Figure 7:
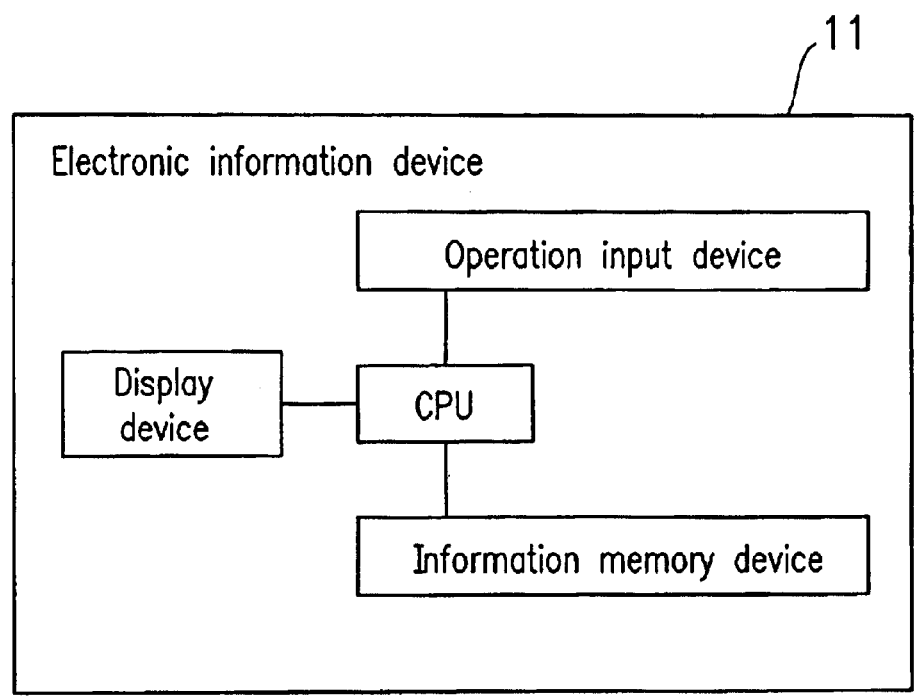
FIG. 7 is a block diagram illustrating an electronic information device including a semiconductor memory device according to the present invention.

The semiconductor memory device according to the present invention can be easily incorporated in an electronic information device such as, for example, a cellular phone or a computer, with the effect of the present invention being provided. One such example is an electronic information device 11 shown in FIG. 7. The electronic information device 11 includes an information memory device such as a flash memory (e.g., flash EEPROM), an operation input device, a display device for displaying, for example, an initial screen or an information processing result, and a CPU (central processing unit) for receiving various operation instructions from the operation input device (e.g., input operations for various functions of a cellular phone) and performing various type of processing based on a prescribed information processing program or data obtained therefrom.

The semiconductor memory device according to the present invention can be conveniently used as the information memory device. The semiconductor memory device according to the present invention determines whether the selected word line is defective or not and optimizes the path for selecting a redundant word line, in accordance with whether the memory operation to be performed is data read, or other operations such as data write or data erase.

In the inverter-type redundant word line driver CRDRV21 shown in FIG. 3A and the latch-type redundant word line driver CRDRV22 shown in FIG. 3B, one block selection signal is used as one of the signals involved in selection of a redundant word line. Depending on the structure of the memory array, the block selection signal is not necessary or another selection signal can be used.

As described above, according to the present invention, a redundant word line selection signal is output in the state where the path, for determining whether the selected word line is defective or not and selecting a redundant word line, is optimized in accordance with the type of memory operation to be performed. Therefore, during data read, the redundant word line selection signal does not pass through the circuits, which are involved only in memory operations other than data read (for example, data write and data erase), for raising the potential of the selected redundant word line. Thus, the transmission of the control signal for selecting the redundant word line is prevented from being unnecessarily delayed. This easily shortens the access time for data read.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising a redundant memory cell, wherein the redundant memory cell is accessible based on an input address signal by a redundant word line selection signal which is output in accordance with whether data read is to be preformed or a memory operation other than data read is to be performed by using different selection paths for data read and for data write and erase.

2. A semiconductor memory device, comprising:
   a regular word line selection circuit for accessing a regular memory cell based on an input address signal; and
   a redundant word line selection circuit for accessing a redundant memory cell based on the input address signal and a defective address signal,
   wherein the redundant word line selection circuit outputs a redundant word line selection signal in accordance with the type of memory operation so as to access the redundant memory cell by using different selection paths for data read and for data write and erase.

3. The semiconductor memory device according to claim 2, wherein the redundant word line selection circuit outputs a first redundant word line selection signal when the memory operation is data read, and outputs a second redundant word line selection signal when the memory operation is an operation other than data read.

4. The semiconductor memory device according to claim 3, wherein the redundant word line selection circuit includes a read control circuit for outputting the first redundant word line selection signal when the memory operation is data read, and a non-read control circuit for outputting the second redundant word line selection signal when the memory operation is an operation other than data read.

5. The semiconductor memory device according to claim 4, where in the read control circuit is driven by an input control signal which represents that the semiconductor memory device is in a data readable state, and the non-read control circuit is stopped by the input control signal.

6. The semiconductor memory device according to claim 2, wherein the redundant word line selection circuit outputs a redundancy determination signal to the regular word line selection circuit when an input address represented by the input address signal matches a defective address represented by the defective address signal.

7. The semiconductor memory device according to claim 6, wherein the redundant word line selection circuit outputs the redundancy determination signal as a first redundancy determination signal to the regular word line selection circuit when the memory operation is data read, and outputs the redundancy determination signal as a second redundancy determination signal to the regular word line selection circuit when the memory operation is an operation other than data read.

8. A semiconductor memory device comprising:
  a regular word line selection circuit for accessing a regular memory cell based on an input address signal; and
  a redundant word line selection circuit for accessing a redundant memory cell based on the input address signal and a defective address signal,
  wherein the redundant word line selection circuit outputs a first redundant word line selection signal when the memory operation is data read, and outputs a second redundant word line selection signal when the memory operation is an operation other than data read,
  wherein the redundant word line selection circuit includes:
  a read control circuit for outputting the first redundant word line selection signal when the memory operation is data read, and a non-read control circuit for outputting the second redundant word line selection signal when the memory operation is an operation other than data read,
  a comprehensive redundancy determination circuit for, when an input address represented by the input address signal matches a defective address represented by the defective address signal, outputting a determination signal which represents whether a defective word line corresponding to the defective address is to be replaced with a redundant word line,
  the read control circuit, and
  a redundant word line driver circuit for selectively driving a prescribed redundant word line based on a redundant word line selection signal from the read control circuit or the non-read control circuit,
  wherein the non-read control circuit includes an erase processing circuit for performing data erase at the time of data erase, and a forcible redundant word line selection control circuit for outputting the second redundant word line selection signal upon receipt of an output from the erase processing circuit at the time of an operation other than data read.

9. The semiconductor memory device according to claim 8, wherein the redundant word line driver circuit selectively drives a prescribed redundant word line based on the first redundant word line selection signal which is input thereto during data read or based on the second redundant word line selection signal which is input thereto during an operation other than data read.

10. The semiconductor memory device according to claim 8, wherein the read control circuit outputs the first redundant word line selection signal directly to the redundant word line driver circuit during data read.

11. An electronic information device using the semiconductor memory device according to claim 1 to determine whether a selected word line is defective or not and optimize a path for selecting a redundant word line, in accordance with the type of memory operation and thus to shorten an access time to a memory cell.

12. An electronic information device using the semiconductor memory device according to claim 2 to determine whether a selected word line is defective or not and optimize a path for selecting a redundant word line, in accordance with the type of memory operation and thus to shorten an access time to a memory cell.

* * * * *